United States Patent
Shigemitsu et al.

(10) Patent No.: US 10,306,121 B2
(45) Date of Patent: May 28, 2019

(54) METHOD OF MANUFACTURING CAMERA MODULE AND CAMERA MODULE

(71) Applicant: Sharp Kabushiki Kaisha, Sakai, Osaka (JP)

(72) Inventors: Norimichi Shigemitsu, Sakai (JP); Yoshihiro Sekimoto, Sakai (JP); Masahiro Nakamura, Sakai (JP); Tetsuya Fujimoto, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/543,005

(22) PCT Filed: Dec. 17, 2015

(86) PCT No.: PCT/JP2015/085335
§ 371 (c)(1),
(2) Date: Jul. 12, 2017

(87) PCT Pub. No.: WO2016/117250
PCT Pub. Date: Jul. 28, 2016

(65) Prior Publication Data
US 2018/0013939 A1    Jan. 11, 2018

(30) Foreign Application Priority Data

Jan. 23, 2015 (JP) ................. 2015-011681
Apr. 28, 2015 (JP) ................. 2015-092309

(51) Int. Cl.
*H04N 5/225* (2006.01)
*H04N 5/232* (2006.01)
(Continued)

(52) U.S. Cl.
CPC .......... *H04N 5/2254* (2013.01); *G02B 7/02* (2013.01); *G02B 7/025* (2013.01); *G02B 7/09* (2013.01);
(Continued)

(58) Field of Classification Search
CPC ..... H04N 5/2254; H04N 5/2253; G03B 17/12
See application file for complete search history.

(56) References Cited

U.S. PATENT DOCUMENTS

2005/0237418 A1    10/2005 Sakamoto
2006/0082900 A1 *   4/2006 Sugiyama ............ G02B 15/177
                                                        359/689
(Continued)

FOREIGN PATENT DOCUMENTS

JP    2004-061623 A    2/2004
JP    2005-045754 A    2/2005
(Continued)

OTHER PUBLICATIONS

Offical Communication issued in International Patent Application No. PCT/JP2015/085335, dated Jan. 26, 2016.

*Primary Examiner* — Ahmed A Berhan
(74) *Attorney, Agent, or Firm* — Keating & Bennett, LLP

(57) ABSTRACT

A method of manufacturing a camera module that is low profile and that can achieve superior resolving power, a camera module, and an imaging device are provided. A positioning step of positioning an object-side group optical unit (12*a*) along an optical axis direction with the use of a jig (40) such that the object-side group optical unit (12*a*) is located so as not to be in contact with an image-plane-side group lens (32*a*) and a fixing step of fixing the object-side group optical unit (12*a*) to a lens holder (20) are included.

8 Claims, 12 Drawing Sheets

(51) Int. Cl.
*G02B 7/02* (2006.01)
*G03B 17/02* (2006.01)
*G03B 17/12* (2006.01)
*G03B 43/00* (2006.01)
*G02B 7/09* (2006.01)
*G02B 13/00* (2006.01)
*G02B 3/00* (2006.01)
*H01L 27/146* (2006.01)

(52) U.S. Cl.
CPC ........ *G02B 13/001* (2013.01); *G03B 17/02* (2013.01); *G03B 17/12* (2013.01); *G03B 43/00* (2013.01); *H01L 27/14618* (2013.01); *H01L 27/14625* (2013.01); *H01L 27/14627* (2013.01); *H04N 5/2253* (2013.01); *H04N 5/2257* (2013.01); *H04N 5/232* (2013.01); *G02B 3/0006* (2013.01)

(56) References Cited

U.S. PATENT DOCUMENTS

| | | |
|---|---|---|
| 2006/0146170 A1 | 7/2006 | Saito et al. |
| 2007/0242941 A1 | 10/2007 | Hu et al. |
| 2009/0015706 A1 | 1/2009 | Singh |
| 2010/0110270 A1 | 5/2010 | Sekimoto et al. |
| 2010/0177238 A1 | 7/2010 | Saito |
| 2011/0134305 A1 | 6/2011 | Sano et al. |
| 2012/0081801 A1 | 4/2012 | Duparre et al. |
| 2013/0176469 A1 | 7/2013 | Sano et al. |
| 2013/0314810 A1* | 11/2013 | Sekimoto ............... G02B 7/021 359/823 |

FOREIGN PATENT DOCUMENTS

| | | |
|---|---|---|
| JP | 2005-148109 A | 6/2005 |
| JP | 2008-299271 A | 12/2008 |
| JP | 2009-533701 A | 9/2009 |
| JP | 2010-134409 A | 6/2010 |
| JP | 2010-525413 A | 7/2010 |
| JP | 2011-049274 A | 3/2011 |
| JP | 2012-163963 A | 8/2012 |
| JP | 2012-529069 A | 11/2012 |
| JP | 2012-256017 A | 12/2012 |
| JP | 2012-256040 A | 12/2012 |
| JP | 2014-029547 A | 2/2014 |
| KR | 10-2011-0037272 A | 4/2011 |
| WO | 2009/016949 A1 | 2/2009 |

* cited by examiner

| | |
|---|---|
| 10a: CAMERA MODULE | 22: PERMANENT MAGNET |
| 12a: OBJECT-SIDE GROUP OPTICAL UNIT | 24a: ADHESIVE |
| 14: IMAGING GROUP LENS | 26a: IMAGING UNIT |
| 16: LENS BARREL | 28: IMAGE SENSOR |
| 17: FLANGE SURFACE | 30: SUBSTRATE |
| 18a: LENS DRIVING DEVICE | 32a: IMAGE-PLANE-SIDE GROUP LENS |
| 19a: ABUTMENT SURFACE | 34: COVER GLASS |
| 20: LENS HOLDER | |

| 10b: CAMERA MODULE | 22: PERMANENT MAGNET |
| 12a: OBJECT-SIDE GROUP OPTICAL UNIT | 26a: IMAGING UNIT |
| 14: IMAGING GROUP LENS | 28: IMAGE SENSOR |
| 16: LENS BARREL | 30: SUBSTRATE |
| 17: FLANGE SURFACE | 32b: IMAGE-PLANE-SIDE GROUP LENS |
| 18a: LENS DRIVING DEVICE | 34: COVER GLASS |
| 19a: ABUTMENT SURFACE | 35: PROTRUSION PORTION |
| 20: LENS HOLDER | |

10e: CAMERA MODULE
12a: OBJECT-SIDE GROUP OPTICAL UNIT
14: IMAGING GROUP LENS
16: LENS BARREL
17: FLANGE SURFACE
18a: LENS DRIVING DEVICE
19a: ABUTMENT SURFACE

20: LENS HOLDER
22: PERMANENT MAGNET
24: ADHESIVE
26e: FLIP CHIP SUBSTRATE
32a: IMAGE-PLANE-SIDE GROUP LENS
34: COVER GLASS

| | |
|---|---|
| 10f: CAMERA MODULE | 22: PERMANENT MAGNET |
| 12a: OBJECT-SIDE GROUP OPTICAL UNIT | 24a: ADHESIVE |
| 14: IMAGING GROUP LENS | 26a: IMAGING UNIT |
| 16: LENS BARREL | 28: IMAGE SENSOR |
| 17: FLANGE SURFACE | 30: SUBSTRATE |
| 18f: LENS DRIVING DEVICE | 32f: IMAGE-PLANE-SIDE GROUP LENS |
| 19f: ABUTMENT SURFACE | 34: COVER GLASS |
| 19g: BOSS PIN | 37: LEG PORTION |
| 20: LENS HOLDER | |

| | |
|---|---|
| 10g: CAMERA MODULE | 24a: ADHESIVE |
| 12a: OBJECT-SIDE GROUP OPTICAL UNIT | 26a: IMAGING UNIT |
| 14: IMAGING GROUP LENS | 28: IMAGE SENSOR |
| 16: LENS BARREL | 30: SUBSTRATE |
| 17: FLANGE SURFACE | 32g: IMAGE-PLANE-SIDE GROUP LENS |
| 18f: LENS DRIVING DEVICE | 33: EDGE PORTION |
| 19f: ABUTMENT SURFACE | 34: COVER GLASS |
| 19g: BOSS PIN | 37g: LEG PORTION |
| 20: LENS HOLDER | 38: IMAGE-SIDE PLANAR SURFACE PORTION |
| 22: PERMANENT MAGNET | 39: BREAK |

58: CUTTING GUIDE
32c: IMAGE-PLANE-SIDE GROUP LENS

10i: CAMERA MODULE
12a: OBJECT-SIDE GROUP OPTICAL UNIT
14: IMAGING GROUP LENS
16: LENS BARREL
17: FLANGE SURFACE
18a: LENS DRIVING DEVICE
19a: ABUTMENT SURFACE
20: LENS HOLDER
22: PERMANENT MAGNET
24a: ADHESIVE
26a: IMAGING UNIT
28: IMAGE SENSOR
30: SUBSTRATE
32i: IMAGE-PLANE-SIDE GROUP LENS
34: COVER GLASS
60: LEG PORTION

METHOD OF MANUFACTURING CAMERA MODULE AND CAMERA MODULE

TECHNICAL FIELD

The present invention relates to a method of manufacturing a camera module. The present invention also relates to an image-plane-side group lens to be used in a camera module. The present invention also relates to a method of manufacturing an image-plane-side group lens. The present invention further relates to an image sensor.

BACKGROUND ART

In recent years, the number of pixels in a camera module embedded in a small-sized electronic device is increasing, and the size of such a camera module is being reduced. In other words, there is a demand for achieving a low-profile, small-sized camera module having superior resolving power.

In order to achieve superior resolving power, an imaging device having five or six lenses is in the mainstream in recent years.

Examples of such an imaging device having five or six lenses include the imaging devices disclosed in PTL 1 and PTL 2. However, although an imaging device having five or six lenses can provide good resolving performance, the total optical length of the optical system increases, which leads to an increase in the profile of the imaging device.

Meanwhile, PTL 3 and PTL 4 disclose a method of adjusting an image plane and the tilt of a lens. Specifically, PTL 3 discloses a method of positioning an imaging group lens with high accuracy by making the bottom surface of a lens barrel abut against the surface of a sensor cover in a camera module having a single group lens. In addition, PTL 4 discloses a method of simplifying the positioning of an initial position by positioning the height of the initial position of a group lens with the use of a jig in a camera module having a single group lens.

CITATION LIST

Patent Literature

PTL 1: Japanese Unexamined Patent Application Publication No. 2012-163963 (published on Aug. 30, 2012)
PTL 2: Japanese Unexamined Patent Application Publication No. 2014-29547 (published on Feb. 13, 2014)
PTL 3: Japanese Unexamined Patent Application Publication No. 2010-134409 (published on Jun. 17, 2010)
PTL 4: Japanese Unexamined Patent Application Publication No. 2012-256017 (published on Dec. 27, 2012)

SUMMARY OF INVENTION

Technical Problem

However, existing techniques such as those disclosed in PTL 3 and PTL 4 employ a configuration that includes a single group lens, which thus suffers from a problem in that superior resolution cannot be expected.

The present invention has been made in view of the problem described above and is directed to providing a camera module that can achieve superior resolution as compared to the existing techniques.

Solution to Problem

To address the issue described above, a method of manufacturing a camera module according to an aspect of the present invention is a method of manufacturing a camera module that includes an object-side group optical unit provided on an object side, an image-plane-side group lens provided on an image sensor, and a lens driving device having a lens holder that holds the object-side group optical unit and in which the object-side group optical unit and the lens driving device are disposed on an object side of the image-plane-side group lens, and the method includes a positioning step of positioning the object-side group optical unit along an optical axis direction with the use of a jig such that the object-side group optical unit is located so as not to be in contact with the image-plane-side group lens and a fixing step of fixing the object-side group optical unit to the lens holder.

In addition, an image-plane-side group lens according to an aspect of the present invention is an image-plane-side group lens to be used in a camera module and includes a leg portion at an edge portion on an image plane side.

In addition, a method of manufacturing an image-plane-side group lens to be used in a camera module according to an aspect of the present invention includes a disposing step of disposing a softened resin material between a first mold in which a planar surface portion is formed and a second mold in which a convex portion is formed at a position that opposes the planar surface portion, an approaching step of causing the first mold and the second mold to approach each other, and a curing step of forming a resin member having a substantially planar planar surface portion on one surface and a concave portion on another surface by curing the resin material.

In addition, an image sensor to be used in a camera module according to an aspect of the present invention includes a light-receiving region and a peripheral region that is located so as to surround the light-receiving region and that abuts against an image-plane-side group lens, and the light-receiving region is formed to have a lower height than the peripheral region.

Advantageous Effects of Invention

According to an aspect of the present invention, an effect of achieving a low-profile camera module is obtained as the object-side group optical unit and the image-plane-side group lens are provided. In addition, as the object-side group optical unit is positioned with the use of the jig, the position of the object-side group optical unit along the optical axis direction can be determined with high accuracy; thus, superior resolving power can be achieved, and the producibility improves.

In addition, the image-plane-side group lens according to an aspect of the present invention is an image-plane-side group lens to be used in a camera module and includes the leg portion at the edge portion on the image plane side; thus, a camera module provided with such an image-plane-side group lens can achieve superior resolving power, and the producibility improves.

In the method of manufacturing an image-plane-side group lens according to an aspect of the present invention, the softened resin material is disposed between the first manufacturing mold and the second manufacturing mold, and the first manufacturing mold and the second manufacturing mold are caused to approach each other; thus, a thin image-plane-side group lens can be manufactured, and a low-profile camera module can be achieved. In addition, an image-plane-side group lens to be manufactured has a substantially planar planar surface portion on one surface and a concave portion on another surface; thus, a camera module in which this image-plane-side group lens is mounted can achieve superior resolving power.

In the image sensor according to an aspect of the present invention, the light-receiving region does not abut against the image-plane-side group lens; thus, the light-receiving region is not damaged, and a camera module in which this image sensor is mounted can achieve superior resolution.

DESCRIPTION OF EMBODIMENTS

First Embodiment

Hereinafter, an embodiment of the present invention will be described in detail.
(Configuration of Camera Module)

Figure 1:
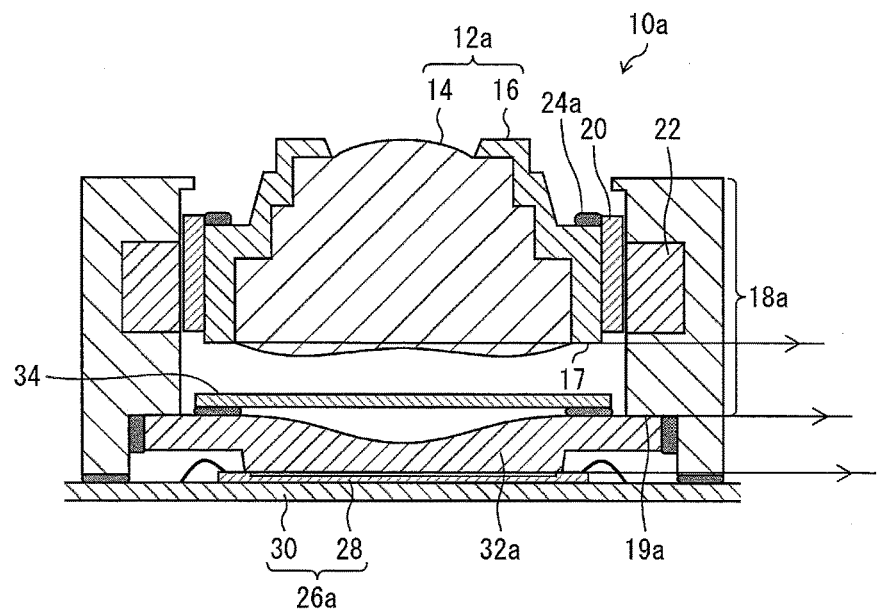
FIG. 1 is a sectional view of a camera module according to a first embodiment of the present invention.

FIG. 1 is a sectional view illustrating a structure of a camera module 10a according to a first embodiment of the present invention. The camera module 10a according to the present embodiment is, for example, an imaging device or a camera module to be embedded in a terminal device, such as a smartphone, a cellular phone, or a tablet PC (Personal Computer). The camera module 10a includes an object-side group optical unit 12a, a lens driving device 18a, an imaging unit 26a, an image-plane-side group lens 32a, and a cover glass 34.

The object-side group optical unit 12a is provided on an object side in the camera module 10a and disposed on the object side of the image-plane-side group lens 32a. The object-side group optical unit 12a includes an imaging group lens 14 and a lens barrel 16 that houses the imaging group lens 14. The imaging group lens 14 is a convex lens system. In addition, the object-side group optical unit 12a includes a flange surface 17 provided on the bottom portion.

The lens driving device 18a is disposed on the object side of the image-plane-side group lens 32a and moves the object-side group optical unit 12a. A cylindrical opening is formed in the lens driving device 18a. The lens driving device 18a includes a lens holder 20 and a permanent magnet 22. The lens barrel 16 is bonded and fixed to the lens holder 20 with an adhesive 24a, and the lens holder 20 holds the object-side group optical unit 12a.

When the lens driving device 18a includes a mechanism system for moving the lens holder 20 in the optical axis direction, or in other words, a mechanism system for achieving an autofocus (AF) function, the lens holder 20 may include an AF coil for achieving the AF function. A current is passed through the AF coil in accordance with a driving instruction from a control unit of a terminal device or the like, for example, in which the camera module 10a is embedded. Thus, the current that flows through the AF coil interacts with the magnetic field generated from the permanent magnet 22, and a thrust force that moves the AF coil in the optical axis direction is generated. As a result, the object-side group optical unit 12a moves back and forth in the optical axis direction. Thus, the autofocus (AF) control of the object-side group optical unit 12a can be achieved, and a focus can be obtained with respect to a variety of imaging ranges.

In addition, when the lens driving device 18a includes a mechanism system for moving the lens holder 20 in the direction normal to the optical axis, or in other words, a mechanism system for achieving OIS (Optical Image Stabilizer), the lens holder 20 may include an OIS coil for achieving the OIS function. A current is passed through the OIS coil in accordance with a driving instruction from a control unit of a terminal device or the like, for example, in which the camera module 10a is embedded. Thus, the current that flows through the OIS coil interacts with the magnetic field generated from the permanent magnet 22, and a thrust force that moves the OIS coil in the direction perpendicular to the optical axis direction is generated. As a result, the object-side group optical unit 12a moves back and forth in the direction perpendicular to the optical axis direction. Thus, image stabilization control of the object-side group optical unit 12a can be achieved.

It is to be noted that the lens driving device 18a described above is a lens driving device of a VCM (Voice Coil Motor) type. However, the lens driving device 18a is not limited to the VCM type. For example, a lens driving device of a variety of systems, such as a type that uses a stepping motor or a type that uses a piezoelectric element, can be employed.

The imaging unit 26a includes an image sensor 28 that converts an optical signal received via the image-plane-side group lens 32a to an electric signal and a substrate 30 to which the image sensor 28 is fixed through wire bonding. An example of the image sensor 28 is a solid-state image sensor, and more specific examples thereof include a CCD (Charge Coupled Device) and a CMOS (Complementary Metal Oxide Semiconductor).

The image-plane-side group lens 32a is provided on the image sensor 28 such that the image plane side thereof abuts against the imaging unit 26a and is disposed such that an edge portion 33 (refer to FIG. 3(d)) on the object side abuts against an abutment surface 19a formed on the bottom portion of the lens driving device 18a. Here, as illustrated in FIG. 1, the abutment surface 19a is a surface formed so as to oppose the substrate 30 with the image-plane-side group lens 32a interposed therebetween. The edge portion 33 on the object side of the image-plane-side group lens 32a abuts against the abutment surface 19a formed on the bottom portion of the lens driving device 18a; thus, the image-plane-side group lens 32a does not tilt, and superior resolving power can be achieved.

The image-plane-side group lens 32a includes an object-side surface that is a surface oriented toward the object side and an image-side surface that is a surface oriented toward the image plane side. The object-side surface of the image-plane-side group lens 32a is a concave surface, and the image-plane-side group lens 32a forms a concave lens system. In other words, the image-plane-side group lens 32a, together with the imaging group lens 14, forms a telephoto-type configuration, which can achieve good resolving performance with a low-profile configuration. In addition, the image-plane-side group lens 32a is a lens that is formed to have a substantially planar surface on the image-side surface. In other words, the image-side surface is not limited to a planar surface and can have any shape as long as light can pass therethrough. Alternatively, the image-side surface may be a surface through which a change in the optical characteristics (refractive power, decentering, etc.) to be brought about is small enough to be neglected in the optical system of the camera module 10a. Examples of such a surface include a surface in which fine (e.g., in the order of nanometers) concavities and convexities to reduce the reflectance of light are formed and a surface that is slightly curved. In this manner, aberration can be corrected favorably by causing an optical system of a substantially planar surface to approach the image plane.

Figure 2:
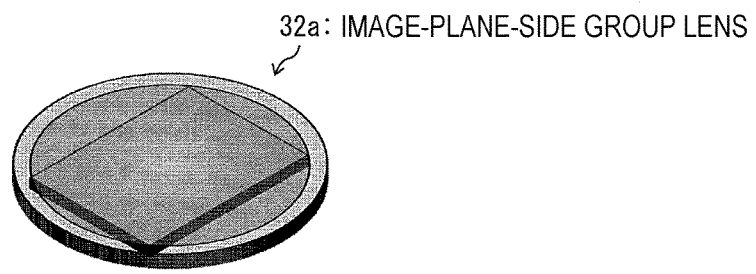
FIG. 2 is a perspective view of an image-plane-side group lens according to the first embodiment of the present invention.

In addition, as illustrated in FIG. 2, when the image-plane-side group lens 32a is viewed from the image plane side, the shape of a projection portion on the image-side surface is rectangular. However, the shape of the projection portion on the image-side surface is not limited to be rectangular and may be a shape other than a rectangle that can be regarded as a rectangle. Examples of such a shape other than a rectangle include a rectangle with rounded corners. In other words, it suffices that the outer shape of the image-side surface be substantially rectangular, and the outer shape may be determined in accordance with the shape of a light-receiving portion of the image sensor 28. In this manner, by forming the image-side surface to have a substantially rectangular outer shape, interference between the image-plane-side group lens 32a and the wire bonding of the image sensor 28 can be prevented.

The cover glass 34 (primarily an IR (infrared) cut glass) is disposed on the image-plane-side group lens 32a. Imaging light that has passed through the object-side group optical unit 12a is incident on the cover glass 34. The cover glass 34 has transmission characteristics that allow light having a predetermined wavelength to pass therethrough and block light (primarily infrared rays) having wavelengths other than the predetermined wavelength.

The cover glass 34 may be substantially circular so that the cover glass 34 is housed in the cylindrical opening in the lens driving device 18a. In other words, the shape of the cover glass 34 may be determined in accordance with the shape of the cylindrical opening in the lens driving device 18a. With this configuration, the height from a shoulder portion of the lens driving device 18a to the bottom surface of the substrate 30 can be reduced, and the size of the camera module 10a can be reduced. In the case in which the cover glass 34 has a shape that does not allow the cover glass 34 to be housed in the cylindrical opening in the lens driving device 18a, the height of the shoulder portion of the lens driving device 18a increases by an amount corresponding to the thickness of the cover glass 34, and the size of the camera module 10a cannot be reduced.

It is to be noted that the horizontal arrows in FIG. 1 indicate that the flange surface 17 of the object-side group optical unit 12a, the bottom surface of the image-plane-side group lens 32a, and the light-receiving surface of the image sensor 28 are parallel to one another.

(Method of Manufacturing Camera Module)

Figure 3:
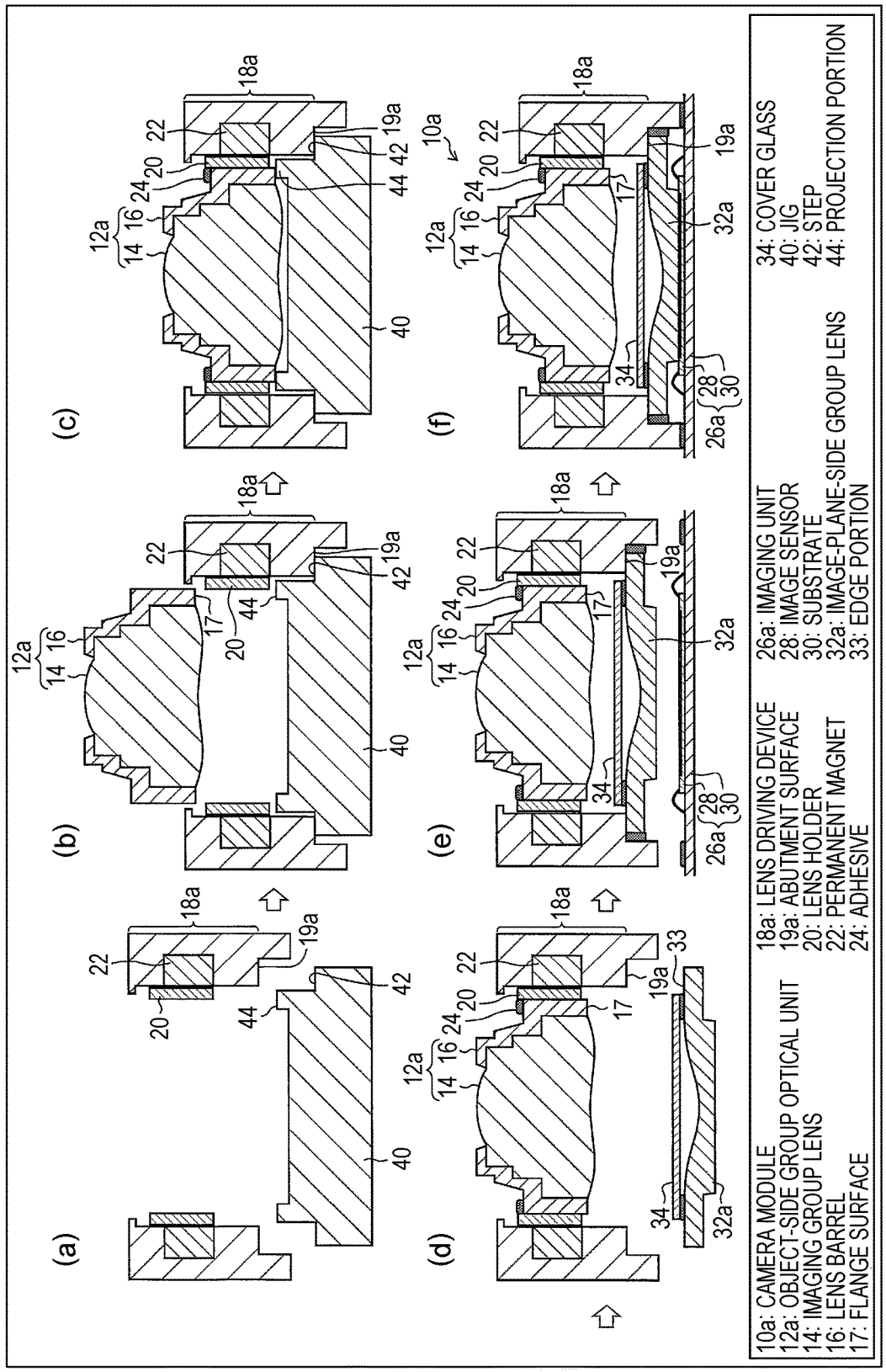
FIG. 3 illustrates each process in a method of manufacturing a camera module according to the first embodiment of the present invention.

Next, a method of manufacturing a camera module will be described with reference to FIG. 3. It is to be noted that each step in the method of manufacturing a camera module described hereinafter is executed primarily by an apparatus for manufacturing a camera module (not illustrated).

As illustrated in FIG. 3(a), a jig 40 is used to assemble the camera module. The jig 40 has a substantially columnar shape and includes a step 42 formed on the outer peripheral surface and a projection portion 44.

(Step 1)

As illustrated in FIG. 3(a), the lens driving device 18a and the jig 40 are prepared, first.

(Step 2)

Next, as illustrated in FIG. 3(b), the abutment surface 19a formed on the bottom portion of the lens driving device 18a is made to abut against the step 42. At this point, the lens holder 20 is configured so as not to make contact with the projection portion 44. Furthermore, the object-side group optical unit 12a is prepared.

(Step 3)

Next, as illustrated in FIG. 3(c), the object-side group optical unit 12a is positioned by making the flange surface 17 thereof abut against the projection portion 44 (positioning step) and is fixed with an adhesive 24a (fixing step). It is to be noted that the jig 40 that does not allow the lens holder 20 to make contact with the projection portion 44 may be used in the positioning step so that the lens holder 20 does not affect the relationship between the flange surface 17 and the projection portion 44 in the positioning step. In addition, typically, the object-side group optical unit 12a alone is inspected with the flange surface 17 serving as a reference, and thus it is preferable that the flange surface 17 of the object-side group optical unit 12a intersect with the optical axis direction substantially perpendicularly.

Here, the relative position between the position of the abutment surface 19a formed on the bottom portion of the lens driving device 18a of the lens driving device 18a against which the image-plane-side group lens 32a abuts and the flange surface 17 of the object-side group optical unit 12a is defined by the jig 40.

(Step 4)

Next, as illustrated in FIG. 3(d), the jig 40 is removed, and the image-plane-side group lens 32a to the upper surface of which the cover glass 34 is bonded is prepared.

(Step 5)

Next, as illustrated in FIG. 3(e), the image-plane-side group lens 32a is made to abut against the abutment surface 19a formed on the bottom portion of the lens driving device 18a and is fixed with an adhesive. Furthermore, the imaging unit 26a is prepared.

(Step 6)

Next, as illustrated in FIG. 3(f), the imaging unit 26a is fixed with an adhesive such that the image sensor 28 abuts against the image plane side of the image-plane-side group lens 32a.

In this manner, by positioning the object-side group optical unit 12a along the optical axis direction such that the object-side group optical unit 12a is not in contact with the image-plane-side group lens 32a with the use of the jig 40, each of the group lenses can be prevented from tilting, and superior resolving power can be achieved. In addition, the object-side group optical unit 12a can be positioned with accuracy; thus, the yield rate improves, and the producibility improves.

Second Embodiment

Figure 4:
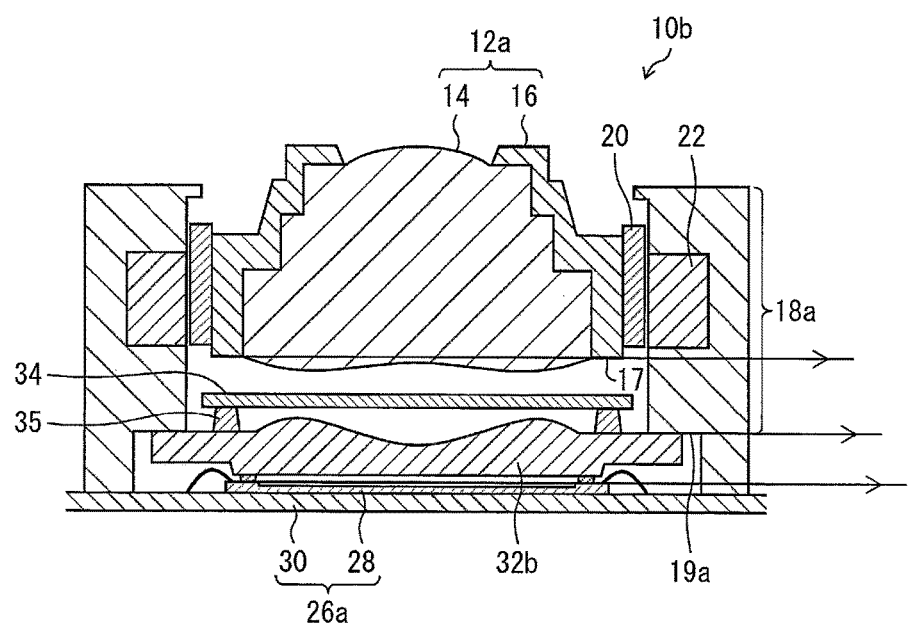
FIG. 4 is a sectional view of a camera module according to a second embodiment of the present invention.

FIG. 4 is a sectional view illustrating a structure of a camera module 10b according to a second embodiment of the present invention. The camera module 10b according to the present embodiment differs from the camera module 10a described above in terms of the shape of an image-plane-side group lens 32b. The image-plane-side group lens 32b has an irregularly curved surface on the object side and includes a portion that bulges higher toward the object side than an edge portion 33 (refer to FIG. 3(d)). The image-plane-side group lens 32b is provided with a protrusion portion 35 to support a cover glass 34. It is to be noted that, although an adhesive is not depicted in the figure, a lens barrel 16 and a lens holder 20 are fixed together with an adhesive, an abutment surface 19a of a lens driving device 18a and the image-plane-side group lens 32b are fixed together with an adhesive, and the image-plane-side group lens 32b and the cover glass 34 are fixed together with an adhesive, in a similar manner to the first embodiment.

Third Embodiment

Figure 5:
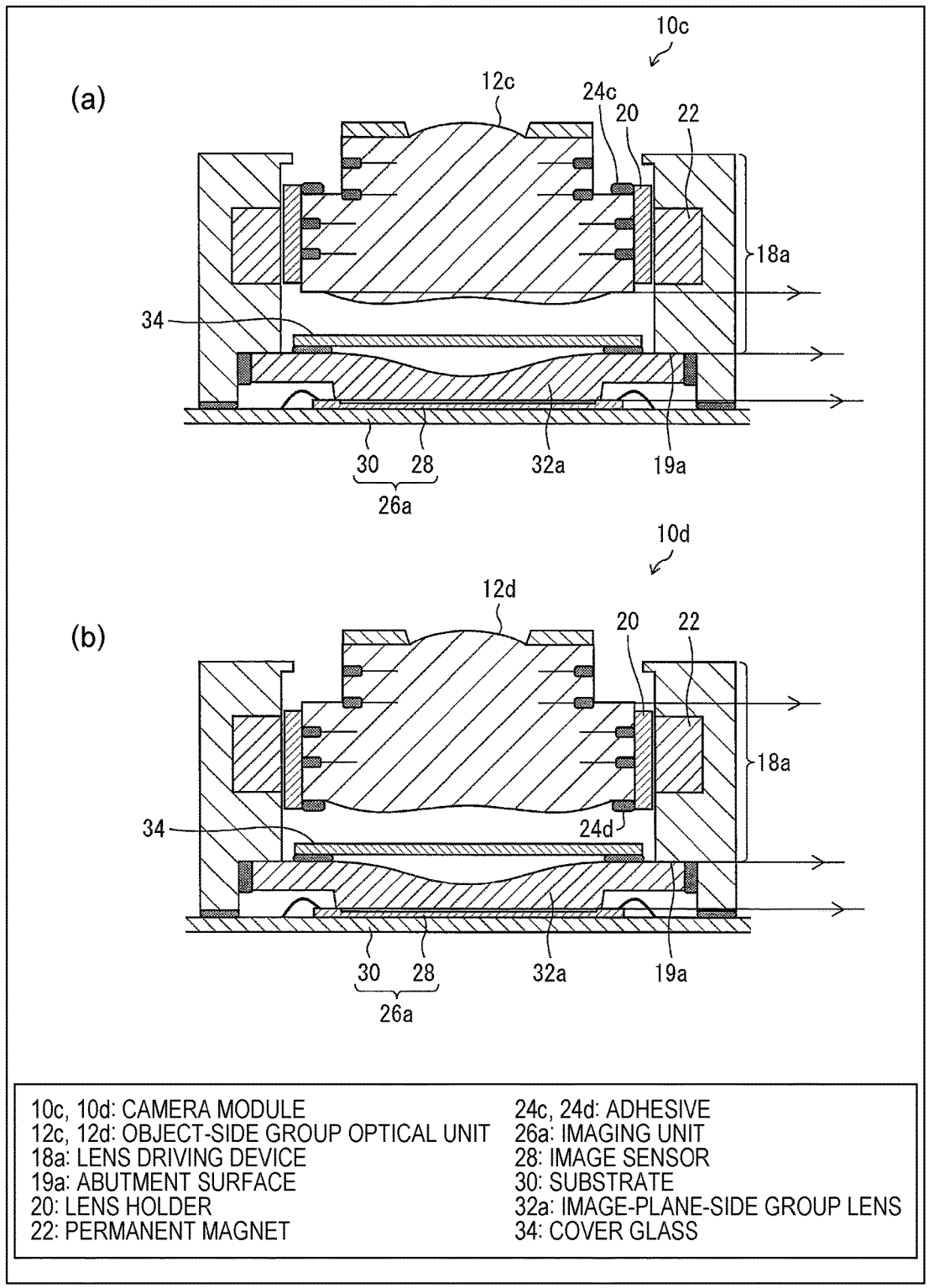
FIG. 5 is a sectional view of a camera module according to a third embodiment of the present invention.

FIGS. 5(a) and 5(b) are sectional views illustrating structures of a camera module 10c and a camera module 10d, respectively, according to a third embodiment of the present invention. The camera module 10c and the camera module 10d according to the present embodiment differ from the camera module 10a described above in that an object-side group optical unit 12c and an object-side group optical unit 12d do not include a lens barrel. FIG. 5(a) illustrates the camera module 10c in which the object-side group optical unit 12c and a lens holder 20 are bonded and fixed together with an adhesive 24c on the object side of the object-side group optical unit 12c. Meanwhile, FIG. 5(b) illustrates the camera module 10c in which the object-side group optical unit 12d and a lens holder 20 are bonded and fixed together with an adhesive 24d on the image plane side of the object-side group optical unit 12d. In the present embodiment, for example, the object-side group optical unit 12c and the object-side group optical unit 12d may be threaded to receive an adhesive and may be fixed to the lens holder 20 by placing an adhesive in the recess portion of the thread for receiving the adhesive. In this manner, the present invention can also be applied to an optical system of a so-called barrelless type. It is to be noted that, when an optical system of a barrelless type is to be employed, the optical system may be fixed to the lens holder by inserting a structural body and placing an adhesive in a gap.

Fourth Embodiment

Figure 6:
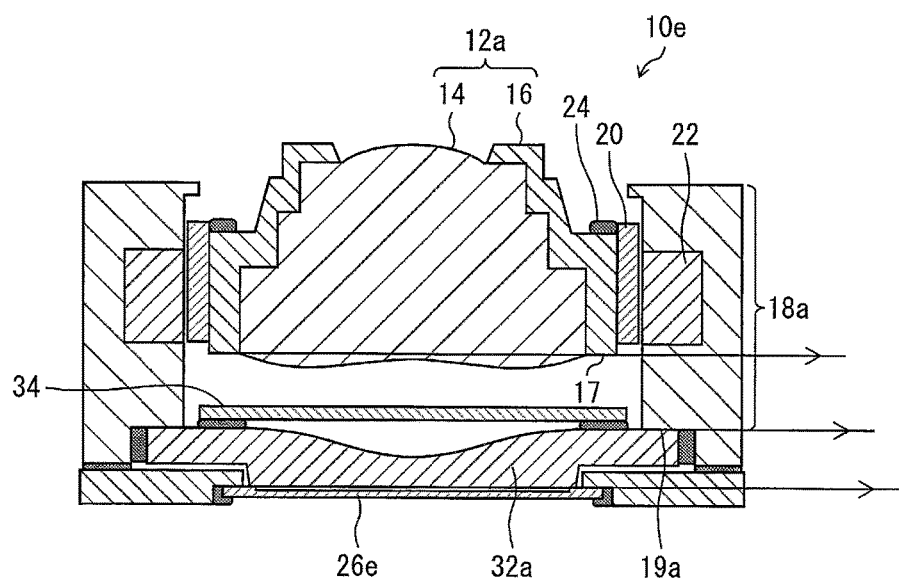
FIG. 6 is a sectional view of a camera module according to a fourth embodiment of the present invention.

FIG. 6 is a sectional view illustrating a structure of a camera module 10e according to a fourth embodiment of the present invention. The camera module 10e according to the present embodiment differs from the camera module 10a described above in that a flip chip substrate 26e is employed in place of the imaging unit 26a of a wire bonding type. A member to be mounted on the flip chip substrate 26e may be a solid-state image sensor, such as a CCD or a CMOS. In the present embodiment as well, the outer shape of the image-side surface of an image-plane-side group lens 32a may be substantially rectangular; thus, interference between the image-plane-side group lens 32a and the flip chip substrate can be prevented.

Fifth Embodiment

Figure 7:
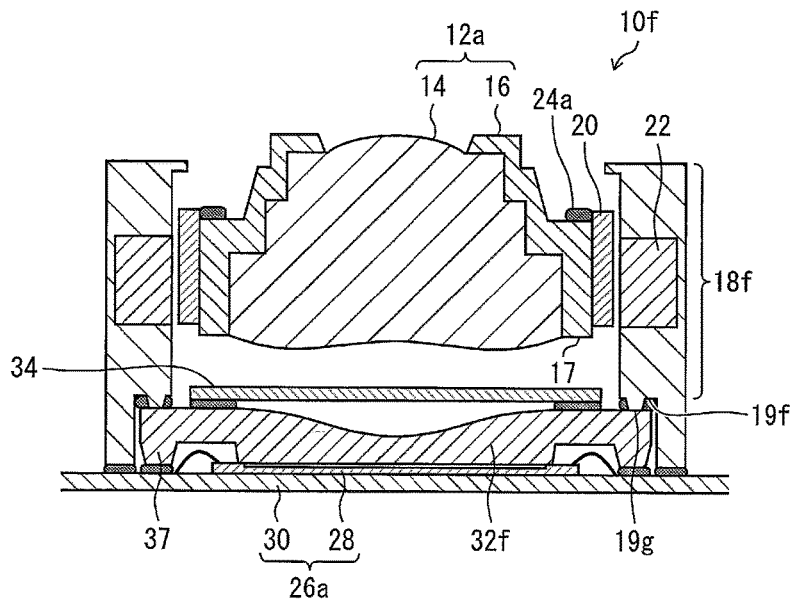
FIG. 7 is a sectional view of a camera module according to a fifth embodiment of the present invention.

FIG. 7 is a sectional view illustrating a structure of a camera module 10f according to a fifth embodiment of the present invention. The camera module 10f according to the present embodiment differs from the camera module 10a described above in that an abutment surface 19f of a lens driving device 18f includes a boss pin 19g, which is a protrusion for positioning. The leading end portion of the boss pin 19g abuts against an edge portion 33 of an image-plane-side group lens 32f, and the abutment surface 19f is bonded and fixed to the image-plane-side group lens 32f. The abutment surfaces 19a of the camera modules 10a through 10e according to the first through fourth embodiments are planar, and thus a high surface accuracy is required for the portion that abuts against the edge portion 33. In contrast, in the present embodiment, the abutment surface 19f is fixed to the edge portion 33 with the boss pin 19g being provided, and thus the abutment surface 19f can be fixed to the image-plane-side group lens 32f with higher accuracy than in the first through fourth embodiments.

Figure 8:
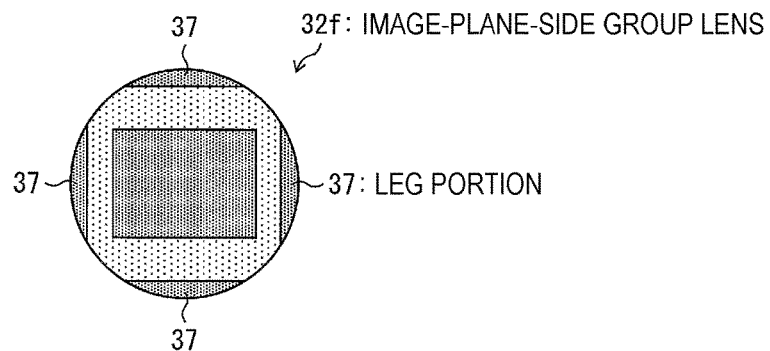
FIG. 8 is a top view of an image-plane-side group lens according to the fifth embodiment of the present invention.

Furthermore, the camera module 10f according to the present embodiment differs from the camera module 10a described above in that an edge portion on the image plane side of the image-plane-side group lens 32f includes a leg portion 37. FIG. 8 is a top view of the image-plane-side group lens 32f according to the present embodiment. The leg portion 37 is the dark portion on the peripheral portion illustrated in FIG. 8. In addition, the dark rectangular portion in the center portion illustrated in FIG. 8 is the portion that abuts against an image sensor 28.

Figure 9:
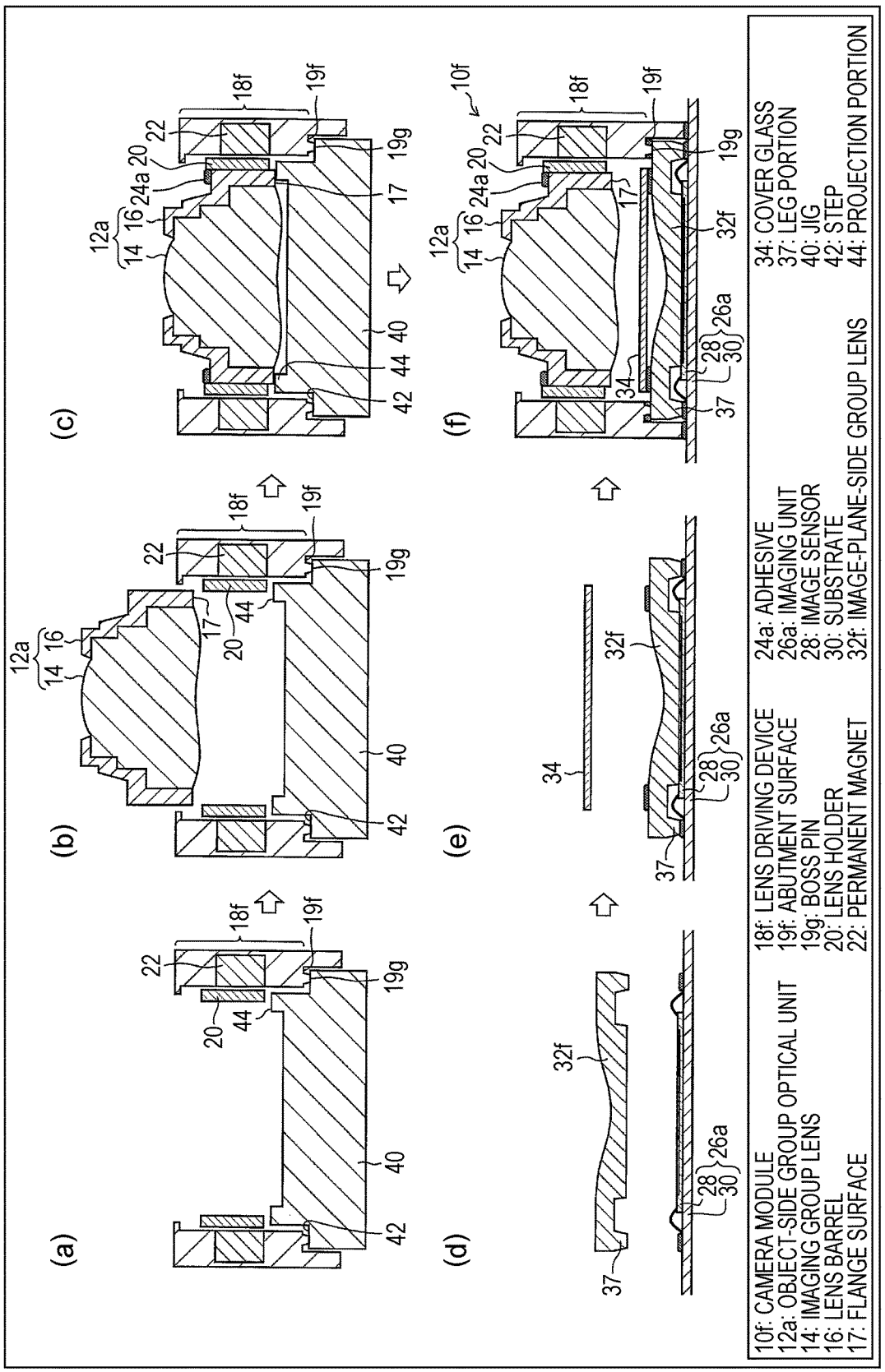
FIG. 9 illustrates each process in a method of manufacturing a camera module according to the fifth embodiment of the present invention.

Next, a method of manufacturing the camera module 10f according to the present embodiment will be described with reference to FIG. 9.

(Step 1)

As illustrated in FIG. 9(a), the lens driving device 18f and a jig 40 are prepared, first.

(Step 2)

Next, as illustrated in FIG. 9(b), the boss pin 19g formed on the bottom portion of the lens driving device 18f is made to abut against a step 42. Furthermore, an object-side group optical unit 12a is prepared.

(Step 3)

Next, as illustrated in FIG. 9(c), the object-side group optical unit 12a is positioned by making a flange surface 17 abut against a projection portion 44 (positioning step) and is fixed with an adhesive 24a (fixing step).

(Step 4)

Next, as illustrated in FIG. 9(d), an imaging unit 26a and the image-plane-side group lens 32f are prepared.

(Step 5)

Next, as illustrated in FIG. 9(e), the image-plane-side group lens 32f is bonded and fixed to the imaging unit 26a. Furthermore, a cover glass 34 is prepared.

(Step 6)

Next, as illustrated in FIG. 9(f), the positioned lens driving device 18f and object-side group optical unit 12a are bonded and fixed to the image-plane-side group lens 32f. In other words, in the present embodiment, the image-plane-side group lens 32f includes the leg portion 37, and thus the camera module 10f can be manufactured by stacking the components in order from the side of the imaging unit 26a. Accordingly, the manufacturing method according to the present embodiment provides higher producibility.

It is to be noted that, although both the boss pin 19g and the leg portion 37 are provided in the present embodiment, the boss pin 19g alone or the leg portion 37 alone may be provided.

Sixth Embodiment

Figure 10:
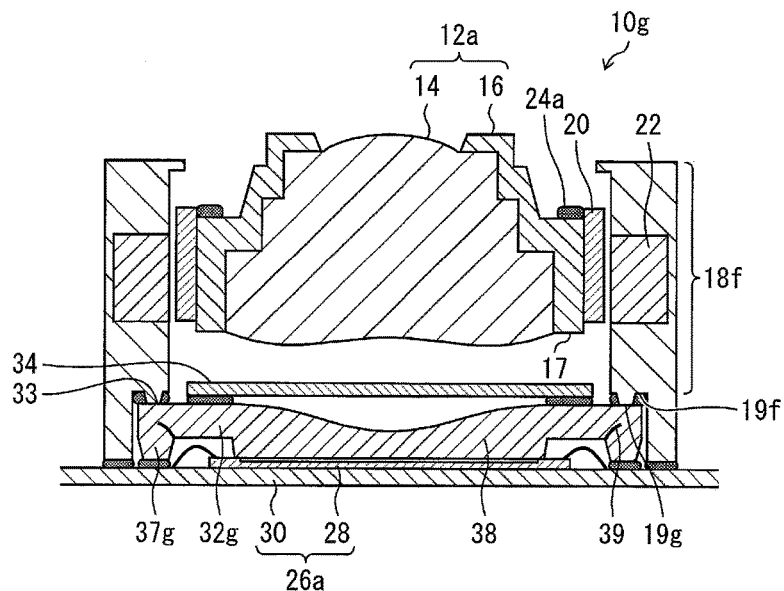
FIG. 10 is a sectional view of a camera module according to a sixth embodiment of the present invention.

FIG. 10 is a sectional view illustrating a structure of a camera module 10g according to a sixth embodiment of the present invention.

The camera module 10g according to the present embodiment differs from the camera module 10f according to the fifth embodiment in that a break is formed at the root of a leg portion 37.

As described in the section on the fifth embodiment above, an image-plane-side group lens 32g includes the leg portion 37g; thus, the camera module 10g can be manufactured by stacking the components in order from the side of an imaging unit 26a, and the producibility of the camera module 10g is high. Meanwhile, as the leg portion 37g is fixed to a substrate 30, the position of the image-plane-side group lens 32g can shift as a result of the substrate 30 curving or the like in the manufacturing process to follow. In addition, this can cause a negative influence on the adjustment of the optical axis of the image-plane-side group lens 32g.

In the present embodiment, in consideration of the above, a break 39 is formed at the root of the leg portion 37g. When the substrate 30 curves or the like, the portion at which the distortion concentrates the most is the root of the leg portion 37g. By forming the break 39 in the root, the leg portion 37g breaks from the break 39 when an excessive load has been added to the image-plane-side group lens 32g as a result of the substrate 30 curving or the like. As a result, the image-plane-side group lens 32g and the leg portion 37g that is fixed to the substrate 30 are separated from each other.

Thus, the camera module 10g of which the producibility is high in the manufacturing process and in which the position of the image-plane-side group lens 32g along the optical axis direction can be prevented from shifting even when the substrate 30 curves or the like can be achieved.

Figure 11:
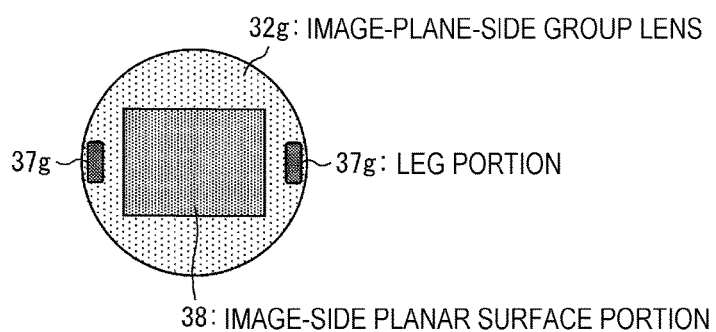
FIG. 11 is a top view of an image-plane-side group lens according to the sixth embodiment of the present invention.

FIG. 11 is a top view of the image-plane-side group lens 32g according to the sixth embodiment of the present invention. As illustrated in FIG. 11, the image-plane-side group lens 32g includes an image-side planar surface portion 38 that abuts against an image sensor 28 and two leg portions 37g that are bonded and fixed to the substrate 30 when the image-plane-side group lens 32g is mounted on the substrate 30.

A feature in the present embodiment lies in that the leg portions 37g that are bonded and fixed to the substrate 30 can be separated from the image-plane-side group lens 32g when the substrate 30 curves or the like. Thus, the configuration in which the leg portions 37g are provided only at two locations so as to facilitate the separation is suitable in the present embodiment.

Seventh Embodiment

In the present embodiment, a method of manufacturing an image-plane-side group lens with the use of casting molding will be described.

A feature of the present embodiment lies in that the image-plane-side group lens to be embedded in a camera module is formed by disposing a softened resin material between two molds, causing the two molds to approach each other, and curing the resin material.

First, a method of manufacturing a camera module 10h according to the present embodiment will be described with reference to FIG. 12.

(Step 1)

As illustrated in FIG. 12(a), a first mold 50 in which planar surface portions 51 are formed is made to oppose a second mold 52 in which convex portions 53 are formed. A plurality of planar surface portions 51 are arrayed in the first mold 50, a plurality of convex portions 53 are arrayed in the second mold 52, and the first mold 50 and the second mold 52 are disposed such that the convex portions 53 oppose the respective planar surface portions 51. Then, a softened resin material 54 is disposed on the first mold 50 (disposing step). It is to be noted that the softened resin material 54 may be disposed on the second mold 52 in this step.

(Step 2)

As illustrated in FIG. 12(b), the first mold 50 and the second mold 52 are caused to approach each other (approaching step).

(Step 3)

Figure 12:
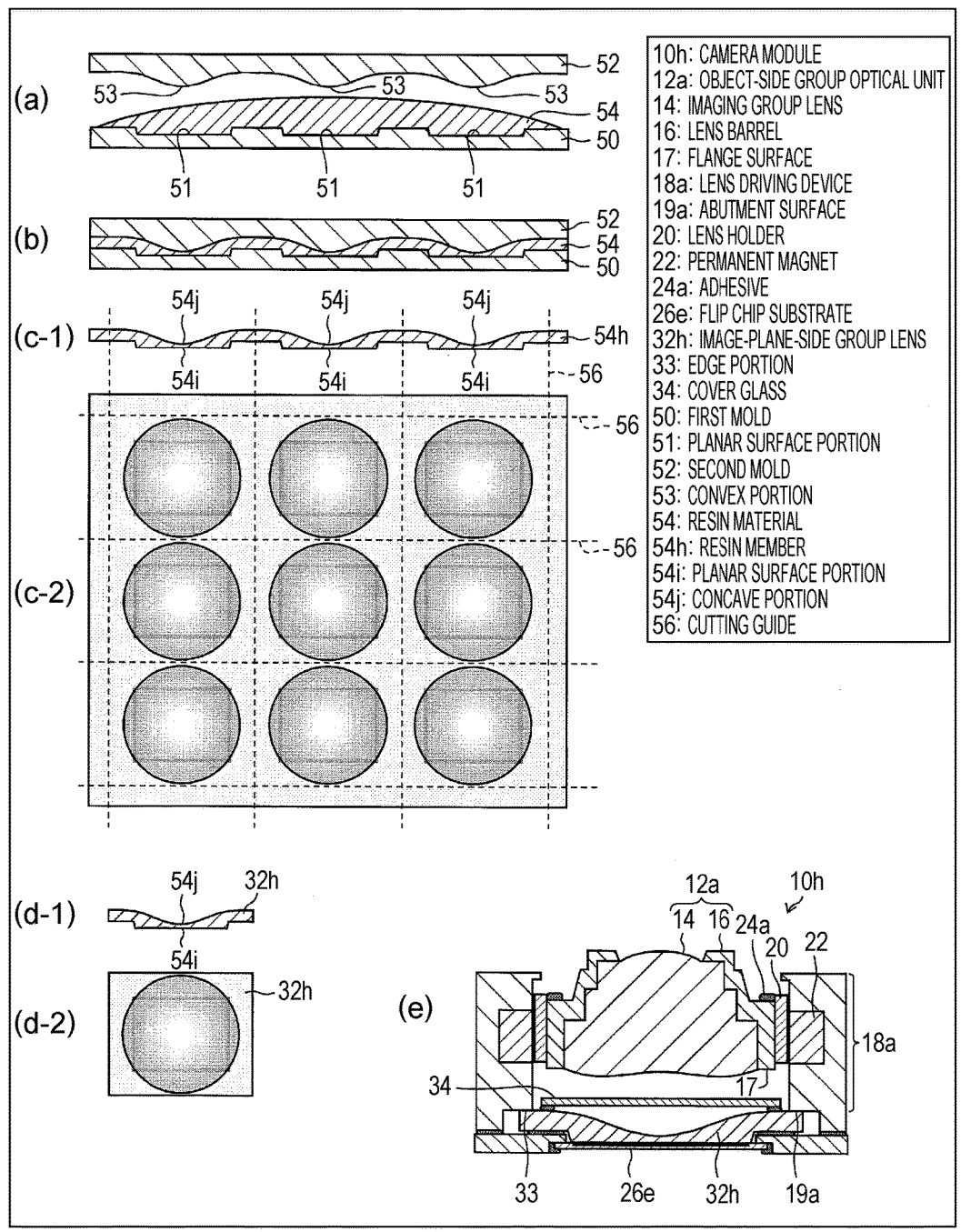
FIG. 12 illustrates each process in a method of manufacturing an image-plane-side group lens according to a seventh embodiment of the present invention.

By curing the resin material 54, a resin member 54h having substantially planar planar surface portions 54i on one surface and concave-shaped concave portions 54j on another surface is formed, as illustrated in FIG. 12(c-1) (curing step). The resin material 54 is preferably a thermosetting resin, an ultraviolet-curable resin, or the like. When the resin material 54 is a thermosetting resin, the resin material 54 is heated to be cured. When the resin material 54 is an ultraviolet-curable resin, the resin material 54 is irradiated with ultraviolet radiation to be cured.

(Step 4)

As illustrated in FIGS. 12(c-1) and 12(c-2), the resin member 54h is cut along cutting guides 56 so that each piece includes a single pair of the planar surface portion 54i and the concave portion 54j. Then, as illustrated in FIGS. 12(d-1) and 12(d-2), a singulated image-plane-side group lens 32h is manufactured (cutting step).

Here, in the present embodiment, the steps from the step 1 through the step 4 for manufacturing the singulated image-plane-side group lens 32h are collectively referred to as casting molding of an image-plane-side group lens.

(Step 5)

As illustrated in FIG. 12(e), the image plane side of the image-plane-side group lens 32h is made to abut against a flip chip substrate 26e. Furthermore, an edge portion 33 on the object side of the image-plane-side group lens 32h is made to abut against an abutment surface 19a formed on the bottom portion of a lens driving device 18a, and the camera module 10h is thus manufactured.

As the image-plane-side group lens 32h is manufactured through casting molding, the shape of the periphery of the image-plane-side group lens 32h can be made rectangular, as illustrated in FIG. 12(d-2). This shape facilitates the step of making the edge portion 33 abut against the abutment surface 19a.

The image-plane-side group lens primarily corrects the curvature of field, and thus it is preferable that the peripheral portion be thicker than the center portion. In other words, when the thickness of the peripheral portion of image-plane-side group lenses is the same, the one with a thinner center portion is preferable.

Figure 13:
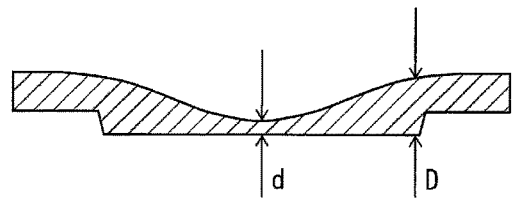
FIG. 13 is a sectional view of an image-plane-side group lens according to the seventh embodiment of the present invention.

FIG. 13 illustrates an image-plane-side group lens manufactured through casting molding. The image-plane-side group lens manufactured through casting molding is thinner at the center portion, and the ratio of the thickness D of the thickest portion in the peripheral portion relative to the thickness d of the center portion (thickness difference ratio) is large. In other words, this is advantageous in correcting the curvature of field. Therefore, embedding an image-plane-side group lens manufactured through casting molding into a camera module is suitable for obtaining a camera module that is low profile and that can achieve superior resolution.

In addition, in the present embodiment, the image-plane-side group lens 32h is formed through casting molding, and thus even in a case in which the flowability of the resin material 54 is low, an image-plane-side group lens having a thin center portion can be manufactured. In contrast, if an image-plane-side group lens is to be manufactured through injection molding, a step of making a resin material flow into a mold is carried out, and thus an image-plane-side group lens having a thin center portion cannot be manufactured if the flowability of the resin material is low.

Figure 14:
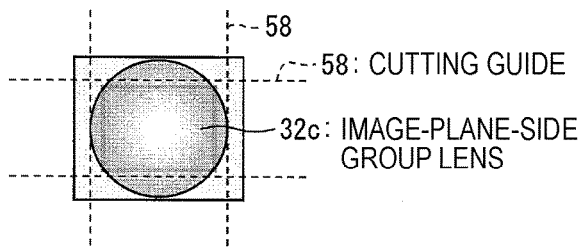
FIG. 14 is a conceptual diagram illustrating a cutting step in a method of manufacturing an image-plane-side group lens according to the seventh embodiment of the present invention.

Furthermore, an edge of a portion of a singulated image-plane-side group lens that abuts against the abutment surface 19a of the lens driving device 18a may be removed so as to retain the portion that abuts against the abutment surface 19a. Thus, an image-plane-side group lens 32c with a reduced size can be obtained. At this point, the edge may be removed so that the smallest portion required for the abutment with the abutment surface 19a is retained. For example, it is preferable that a singulated image-plane-side group lens be cut along cutting guides 58 illustrated in FIG. 14.

Figure 15:
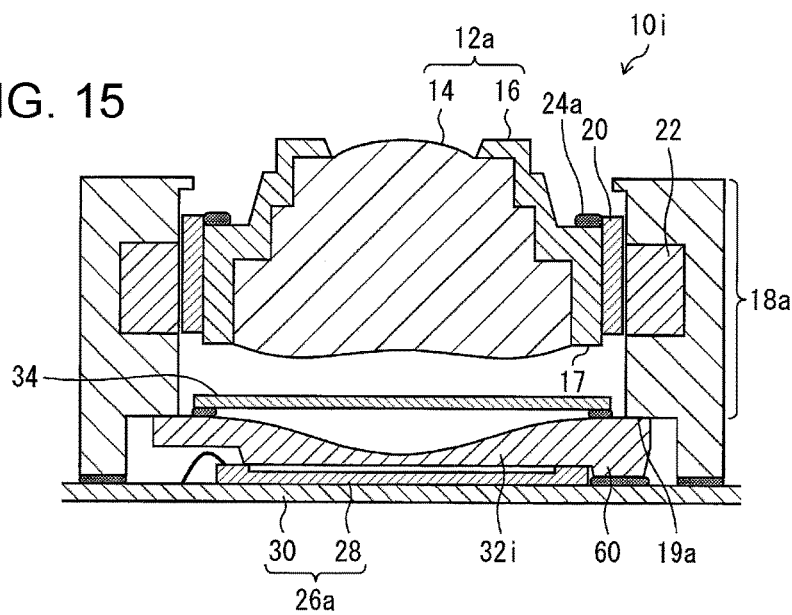
FIG. 15 is a sectional view of a camera module according to a modification of the seventh embodiment of the present invention.

Furthermore, by employing casting molding, an image-plane-side group lens 32i having an asymmetric shape in which a leg portion 60 is provided only on one side as illustrated in FIG. 15 can be manufactured with ease. Thus, even in a case in which a region in a camera module in which an image-plane-side group lens is embedded is small and a region for fixing a footing is provided only on one side, a leg portion can be formed only on an edge portion corresponding to the region on one side, and thus the image-plane-side group lens can be embedded so as to be closer to one side.

Eighth Embodiment

A feature of the present embodiment lies in that an image sensor to be embedded in a camera module includes a light-receiving region and a peripheral region located so as to surround the light-receiving region and the light-receiving region is formed to have a lower height than the peripheral region.

Figure 16:
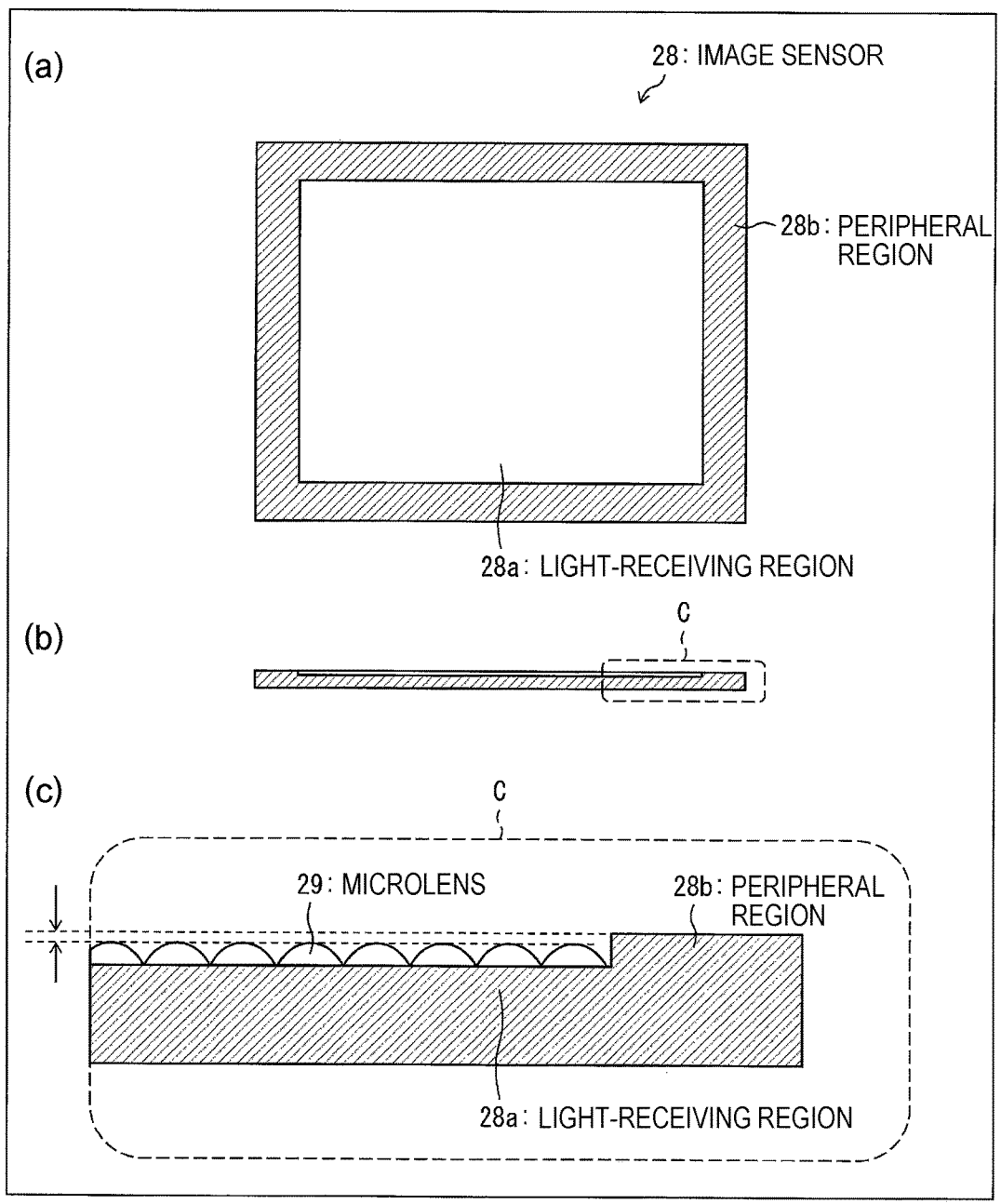
FIG. 16(a) is a top view of an image sensor 28 according to the present embodiment.
FIG. 16(b) is a sectional view of the image sensor 28.
FIG. 16(c) is an enlarged view of a portion c illustrated in FIG. 16(b).

FIG. 16(a) is a top view of an image sensor 28 according to the present embodiment, FIG. 16(b) is a sectional view of the image sensor 28, and FIG. 16(c) is an enlarged view of a portion c illustrated in FIG. 16(b).

As illustrated in FIG. 16(a), the image sensor 28 includes a light-receiving region 28a and a peripheral region 28b located so as to surround the light-receiving region. The light-receiving region 28a is a region in which a plurality of light-receiving elements are arrayed, and the peripheral region 28b is a region in which a logic circuit, an electrode for electrical continuity, and so on are disposed.

As illustrated in FIG. 16(c), the height of the light-receiving region 28a is lower than the height of the peripheral region 28b. In addition, a microlens 29 is provided on the light-receiving region 28a. In the present embodiment, as illustrated in FIG. 16(c), the height of the highest portion of the microlens 29 is lower than the height of the peripheral region 28b.

It is preferable that the difference between the height of the highest portion of the microlens 29 and the height of the peripheral region 28b be set to a range from 5 μm to 20 μm.

Figure 17:
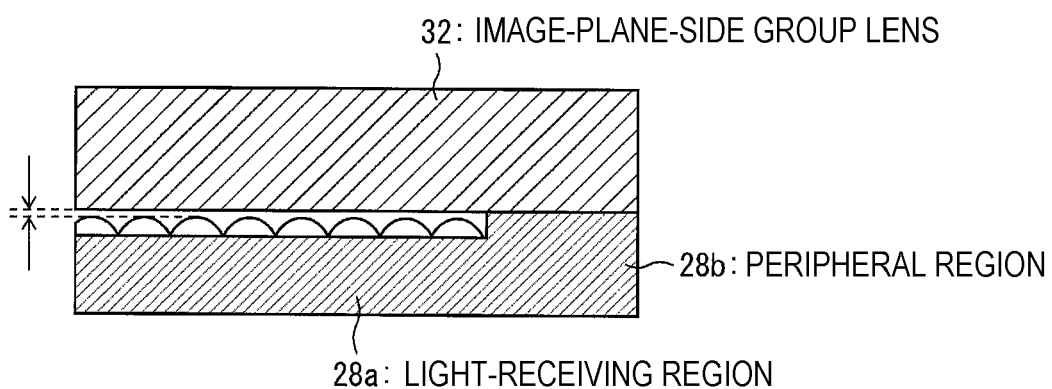
FIG. 17 is a sectional view of a camera module according to an eighth embodiment of the present invention.

As illustrated in FIG. 17, the image sensor 28 abuts against an image-plane-side group lens 32 at the peripheral region 28b. In the present embodiment, the height of the highest portion of the microlens 29 on the light-receiving region 28a is lower than the height of the peripheral region 28b. Thus, even if the image plane side of the image-plane-side group lens 32 is formed to have a planar shape, the image plane side of the image-plane-side group lens 32 does not make contact with the microlens 29. Therefore, while the shape of the image-plane-side group lens 32 is not complex, the image plane side of the image-plane-side group lens 32 can be brought close to the microlens 29 on the light-receiving region 28a while preventing the microlens 29 from being damaged. In reducing the profile of the camera module, it is preferable that the image plane side of the image-plane-side group lens 32 be close to the microlens 29 on the light-receiving region 28a.

Figure 18:
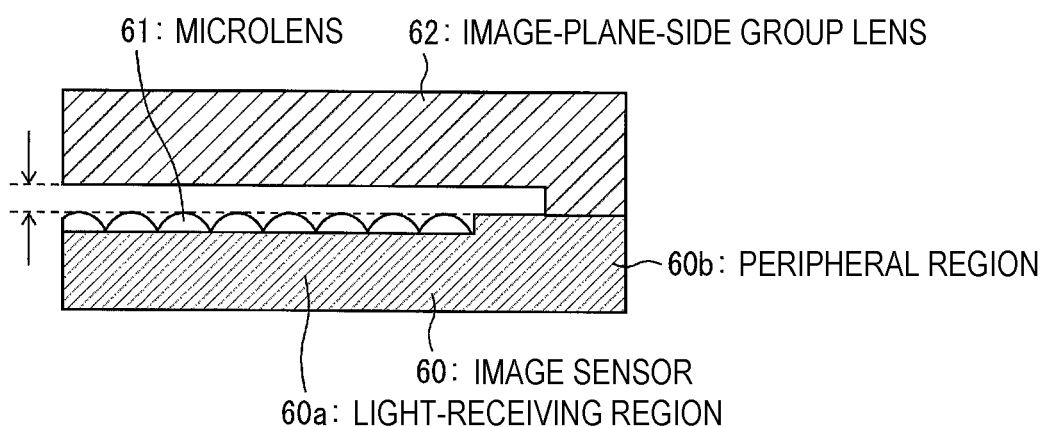
FIG. 18 is a sectional view of a comparative example of the camera module according to the eighth embodiment of the present invention.

In contrast, as a comparative example, a case in which a camera module includes a light-receiving element 60 in which the height of a microlens 61 on a light-receiving region 60a is the same as the height of a peripheral region 60b is illustrated in FIG. 18.

In this comparative example, in order to prevent the microlens 61 from being damaged through a contact between an image-plane-side group lens 62 and the microlens 61, a recess needs to be formed in the image-plane-side group lens 62, as illustrated in FIG. 18. In other words, the image-plane-side group lens 62 needs to be formed to have a complex shape, which is not preferable.

It is to be noted that, although the microlens 29 is provided on the light-receiving region 28a in the present embodiment, the microlens 29 is not an essential element. When a microlens is not provided, the height of the light-receiving region 28a may be raised to the height of the highest portion of the microlens 29 illustrated in FIG. 15 so that the light-receiving region 28a approaches the image plane side of the image-plane-side group lens 32.

CONCLUSION

A method of manufacturing a camera module 10a according to a first aspect of the present invention is a method of manufacturing a camera module 10a that includes an object-side group optical unit 12a provided on an object side, an image-plane-side group lens 32a provided on an image sensor 28, and a lens driving device 18a having a lens holder 20 that holds the object-side group optical unit 12a and in which the object-side group optical unit 12a and the lens driving device 18a are disposed on an object side of the image-plane-side group lens 32a, and the method includes a positioning step of positioning the object-side group optical unit 12a along an optical axis direction with the use of a jig 40 such that the object-side group optical unit 12a is located so as not to be in contact with the image-plane-side group lens 32a and a fixing step of fixing the object-side group optical unit 12a to the lens holder 20.

According to the above configuration, an effect of achieving a low-profile camera module 10a is obtained as the object-side group optical unit 12a and the image-plane-side group lens 32a are provided. In addition, as the object-side group optical unit 12a is positioned with the use of the jig 40, the position of the object-side group optical unit 12a along the optical axis direction can be determined with high accuracy; thus, superior resolving power can be achieved, and the producibility improves.

In a method of manufacturing a camera module 10a according to a second aspect of the present invention, in the above first aspect, the object-side group optical unit 12a may be a convex lens system, and the image-plane-side group lens 32a may be a concave lens system.

According to the above configuration, the object-side group optical unit 12a and the image-plane-side group lens 32a form a telephoto-type configuration, and a low-profile camera module with high resolving performance can be achieved.

In a method of manufacturing a camera module 10a according to a third aspect of the present invention, in the above second aspect, the image-plane-side group lens 32a may include a lens that is formed to have a substantially planar and substantially rectangular surface on an image plane side.

According to the above configuration, aberration can be corrected favorably by bringing an optical system of a substantially planar surface closer. In addition, by forming the image-side surface to have a substantially rectangular outer shape, interference between the image-plane-side group lens 32a and wire bonding of the image sensor 28 or a flip chip substrate 26e can be prevented.

In a method of manufacturing a camera module 10a according to a fourth aspect of the present invention, in any one of the above first through third aspects, the lens driving device 18a may include a mechanism system for moving the lens holder 20 in the optical axis direction.

According to the above configuration, autofocus (AF) control of the object-side group optical unit 12a can be achieved, and a focus can be obtained with respect to a variety of imaging ranges.

In a method of manufacturing a camera module 10a according to a fifth aspect of the present invention, in any one of the above first through fourth aspects, the lens driving device 18a may include a mechanism system for moving the lens holder 20 in a direction normal to the optical axis.

According to the above configuration, image stabilization control of the object-side group optical unit 12a can be achieved.

In a method of manufacturing a camera module 10a according to a sixth aspect of the present invention, in any one of the above first through fifth aspects, the camera module 10a may further include a substantially circular cover glass 34 that abuts against the object side of the image-plane-side group lens 32a.

According to the above configuration, the height from a shoulder portion of the lens driving device 18a to a bottom surface of the camera module 10a can be reduced, and the size of the camera module 10a can be reduced.

In a method of manufacturing a camera module 10a according to a seventh aspect of the present invention, in any one of the above first through sixth aspects, the jig 40 may define a relative position of an abutment surface 19a formed on the bottom portion of the lens driving device 18a and a flange surface 17 of the object-side group optical unit 12a.

According to the above configuration, the relative position of the abutment surface 19a formed on the bottom portion of the lens driving device 18a and the flange surface 17 of the object-side group optical unit 12a can be defined by the jig 40.

In a method of manufacturing a camera module 10a according to an eighth aspect of the present invention, in any one of the above first through seventh aspects, an edge portion 33 on the object side of the image-plane-side group lens 32a may abut against the abutment surface 19a formed on the bottom portion of the lens driving device 18a.

According to the above configuration, the edge portion 33 on the object side of the image-plane-side group lens 32a abuts against the abutment surface 19a formed on the bottom portion of the lens driving device 18a; thus, the image-plane-side group lens 32a does not tilt, and superior resolving power can be achieved.

In a method of manufacturing a camera module 10a according to a ninth aspect of the present invention, in any one of the first through eighth aspects, the image-plane-side group lens may include a leg portion at an edge portion on the image plane side.

According to the above configuration, an image-plane-side group lens 32f includes a leg portion 37, and thus a camera module 10f can be manufactured by stacking components in order from the side of an imaging unit 26a against which the image-plane-side group lens 32f abuts. Accordingly, the manufacturing method according to the present embodiment provides high producibility.

In a method of manufacturing a camera module 10g according to a tenth aspect of the present invention, in the ninth aspect, a break may be formed at a root of the leg portion.

According to the above configuration, a leg portion 37g breaks from a break 39 when an excessive load has been added to an image-plane-side group lens 32g as a result of a substrate 30 curving or the like. As a result, the image-plane-side group lens 32g and the leg portion 37g that is fixed to the substrate 30 can be separated from each other.

In a method of manufacturing camera modules 10a through 10i according to an eleventh aspect of the present invention, in any one of the first through tenth aspects, the image sensor 28 may include a light-receiving region 28a and a peripheral region 28b that is located so as to surround the light-receiving region 28a and that abuts against an image-plane-side group lens 32, and the light-receiving region 28a may be formed to have a lower height than the peripheral region 28b.

According to the above configuration, even if the image-plane-side group lens 32 is formed to have a planar shape on the image plane side, the image plane side of the image-plane-side group lens 32 does not make contact with the light-receiving region 28a of the image sensor 28.

A camera module 10a according to a twelfth aspect of the present invention includes an object-side group optical unit 12a provided on an object side, an image-plane-side group lens 32a provided on an image sensor 28, and a lens driving device 18a having a lens holder 20 that holds the object-side group optical unit 12a, and the object-side group optical unit 12a and the lens driving device 18a are disposed on an object side of the image-plane-side group lens 32a. The object-side group optical unit 12a is fixed to the lens holder 20 such that the object-side group optical unit 12a is located so as not to be in contact with the image-plane-side group lens 32a.

According to the above configuration, an effect of achieving a low-profile camera module is obtained as the object-side group optical unit 12a and the image-plane-side group lens 32a are provided. In addition, the object-side group optical unit 12a is fixed to the lens holder 20 so as not to be in contact with the image-plane-side group lens 32a, and thus superior resolving power can be achieved.

An imaging device according to a thirteenth aspect of the present invention includes the camera module 10a according to the tenth aspect.

According to the above configuration, the profile of the camera module 10a in the imaging device can be reduced, and thus a thin imaging device can be achieved. In addition, superior resolving power can be achieved.

An image-plane-side group lens 32f provided in a camera module according to a fourteenth aspect of the present invention includes a leg portion 37 at an edge portion on an image plane side.

According to the above configuration, the image-plane-side group lens 32f includes the leg portion 37, and thus a camera module 10f can be manufactured by stacking components in order from the side of an imaging unit 26a against which the image-plane-side group lens 32f abuts. Thus, the camera module 10f according to the present embodiment provides high producibility.

In an image-plane-side group lens 32g provided in a camera module 10g according to a fifteenth aspect of the present invention, in the fourteenth aspect, a break 39 may be formed at a root of the leg portion 37g.

According to the above configuration, the leg portion 37g breaks from the break 39 when an excessive load has been added to the image-plane-side group lens 32g as a result of a substrate 30 curving or the like. As a result, the image-plane-side group lens 32g and the leg portion 37g that is fixed to the substrate 30 can be separated from each other.

A method of manufacturing an image-plane-side group lens 32h to be used in a camera module 10h according to a sixteenth aspect of the present invention includes a disposing step of disposing a softened resin material 54 between a first mold 50 in which a planar surface portion 51 is formed and a second mold 52 in which a convex portion 53 is formed at a position that opposes the planar surface portion 51, an approaching step of causing the first mold 50 and the second mold 52 to approach each other, and a curing step of forming a resin member 54h having a substantially planar planar surface portion 54i on one surface and a concave portion 54j on another surface by curing the resin material 54.

According to the above configuration, the image-plane-side group lens 32h having the thin concave portion 54j at a center portion can be formed.

In a method of manufacturing an image-plane-side group lens 32h to be used in a camera module 10h according to a seventeenth aspect of the present invention, in the sixteenth aspect, the planar surface portion 51 may be arrayed in a plurality in the first mold 50, the convex portion 53 may be arrayed in a plurality in the second mold 52, each of the plurality of convex portions 53 may be disposed so as to oppose a corresponding one of the plurality of planar surface portions 51, and the manufacturing method may further include a cutting step of singulating the resin member 54h by cutting the resin member 54h so that each piece includes a single pair of the planar surface portion 54i and the concave portion 54j.

According to the above configuration, a plurality of image-plane-side group lenses 32h can be manufactured at once.

An image sensor 28 to be used in a camera module according to an eighteenth aspect of the present invention includes a light-receiving region 28a and a peripheral region 28b that is located so as to surround the light-receiving region 28a and that abuts against an image-plane-side group lens 32, and the light-receiving region 28a is formed to have a lower height than the peripheral region 28b.

According to the above configuration, even if the image-plane-side group lens 32 is formed to have a planar shape on an image plane side, the image plane side of the image-plane-side group lens 32 does not make contact with the light-receiving region 28a of the image sensor 28.

The present invention is not limited to the embodiments described above, and various modifications can be made within the scope set forth in the claims. An embodiment obtained by combining a disclosed technical means with different embodiments as appropriate is also encompassed by the technical scope of the present invention. Furthermore, a new technical feature can be formed by combining a disclosed technical means with the embodiments.

INDUSTRIAL APPLICABILITY

The present invention can be suitably used in a camera module embedded in a terminal device, such as a smartphone, a cellular phone, or a tablet PC (Personal Computer), and in an imaging device.

REFERENCE SIGNS LIST 10a, 10b, 10c, 10d, 10e, 10f, 10g, 10h, 10i CAMERA MODULE
12a, 12c, 12d OBJECT-SIDE GROUP OPTICAL UNIT
14 IMAGING GROUP LENS
16 LENS BARREL
17 FLANGE SURFACE
18a, 18f LENS DRIVING DEVICE
19a, 19f ABUTMENT SURFACE
19g BOSS PIN
20 LENS HOLDER
22 PERMANENT MAGNET
24a, 24c, 24d ADHESIVE
26a IMAGING UNIT
26e FLIP CHIP SUBSTRATE
28, 60 IMAGE SENSOR
28a, 60a LIGHT-RECEIVING REGION
28b, 60b PERIPHERAL REGION
29, 61 MICROLENS
30 SUBSTRATE
32, 32a, 32b, 32c, 32f, 32g, 32h, 32i, 62 IMAGE-PLANE-SIDE GROUP LENS
33 EDGE PORTION
34 COVER GLASS
35 PROTRUSION PORTION
37, 37g, 60 LEG PORTION
38 IMAGE-SIDE PLANAR SURFACE PORTION
39 BREAK
40 JIG
42 STEP
44 PROJECTION PORTION
50 FIRST MOLD

51 PLANAR SURFACE PORTION
52 SECOND MOLD
53 CONVEX PORTION
54h RESIN MEMBER
54i PLANAR SURFACE PORTION
54j CONCAVE PORTION
56, 58 CUTTING GUIDE

The invention claimed is:

1. A method of manufacturing a camera module, the camera module including an object-side group optical unit provided on an object side, an image-plane-side group lens provided on an image sensor, and a lens driving device having a lens holder that holds the object-side group optical unit, the object-side group optical unit and the lens driving device being disposed on an object side of the image-plane-side group lens, the method comprising:
   a positioning step of positioning the object-side group optical unit along an optical axis direction with the use of a jig such that the object-side group optical unit is located so as not to be in contact with the image-plane-side group lens;
   a first fixing step of fixing the object-side group optical unit to the lens holder,
   a second fixing step of fixing the image-plane-side group lens to the image sensor, and
   a third fixing step of fixing the lens driving device to the image sensor,
   the image-plane-side group lens having a leg portion at an edge portion on an image plane side,
   the leg portion being bonded and fixed to a substrate to which the image sensor is fixed.

2. The method of manufacturing a camera module according to claim 1,
   wherein the object-side group optical unit is a convex lens system, and the image-plane-side group lens is a concave lens system.

3. The method of manufacturing a camera module according to claim 2,
   wherein the image-plane-side group lens includes a lens that is formed to have a substantially planar and substantially rectangular surface on an image plane side.

4. The method of manufacturing a camera module according to claim 1,
   wherein the camera module further includes a substantially circular cover glass that abuts against an object side of the image-plane-side group lens.

5. The method of manufacturing a camera module according to claim 1,
   wherein the jig defines a relative position of an abutment surface formed on a bottom portion of the lens driving device and a flange surface of the object-side group optical unit.

6. The method of manufacturing a camera module according to claim 1,
   wherein an edge portion on the object side of the image-plane-side group lens abuts against the abutment surface formed on the bottom portion of the lens driving device.

7. The method of manufacturing a camera module according to claim 1,
   wherein the lens driving device is bonded and fixed to the substrate.

8. The method of manufacturing a camera module according to claim 1,
   wherein the image-plane-side group lens is integrally molded.

* * * * *